(12) United States Patent
Nakagawa

(10) Patent No.: US 8,129,807 B2
(45) Date of Patent: Mar. 6, 2012

(54) ELECTRO-OPTICAL DEVICE AND ELECTRONIC APPARATUS

(75) Inventor: Masashi Nakagawa, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 400 days.

(21) Appl. No.: 12/566,361

(22) Filed: Sep. 24, 2009

(65) Prior Publication Data

US 2010/0072503 A1   Mar. 25, 2010

(30) Foreign Application Priority Data

Sep. 25, 2008  (JP) ................... 2008-246386

(51) Int. Cl.
*H01L 31/0232*   (2006.01)
(52) U.S. Cl. ...... 257/435; 257/59; 257/72; 257/E21.122
(58) Field of Classification Search .............. 257/59, 257/72, 435, E31.122
See application file for complete search history.

(56) References Cited

FOREIGN PATENT DOCUMENTS

| JP | 2003-262888 | 9/2003 |
|---|---|---|
| JP | 2004-004722 | 1/2004 |
| JP | P3731447 | 10/2005 |

*Primary Examiner* — Samuel Gebremariam
(74) *Attorney, Agent, or Firm* — Maschoff Gilmore & Israelsen

(57) ABSTRACT

An electro-optical device includes a semiconductor layer including a channel region having a channel length along one of a first direction and a second direction, a source region having a source length along the second direction and electrically connected to a data line, a drain region having a drain length including a portion along the first direction and electrically connected to a pixel electrode, and a junction region formed between the channel region and the drain region, and bent in the drain region in plan view; a gate electrode including a main body portion facing the channel region with a gate insulating film interposed therebetween and an enclosure portion including an L-shaped portion enclosing the junction region along the portion bent in the drain region; and a sidewall portion rising or falling from the enclosure portion and including a portion arranged along the side of the second junction region.

12 Claims, 8 Drawing Sheets

ELECTRO-OPTICAL DEVICE AND ELECTRONIC APPARATUS

BACKGROUND

1. Technical Field

The present invention relates to technical fields of an electro-optical device such as a liquid crystal device and an electronic apparatus including the electro-optical device, such as a liquid crystal projector.

2. Related Art

A liquid crystal device which is an example of an electro-optical device is, for example, used as a light modulation unit (light valve) of a projection type display device as well as a direct-view-type display. In particular, in the projection type display device, since strong light from a light source is incident to a liquid crystal light valve, a light-shielding film functioning as a light-shielding unit for blocking the incident light is mounted in the liquid crystal light value such that a Thin Film Transistor (TFT) in the liquid crystal light valve does not cause an increase in light leak current or malfunction by the light. With respect to the light-shielding unit or the light-shielding film, for example, in JP-A-2004-4722, technology for shielding a channel region of a TFT from light by a scan line functioning as a gate electrode is disclosed. In Japanese Patent No. 3731447, a plurality of light-shielding films formed on a channel region and a layer for absorbing the inside-reflected light are provided so as to reduce light which reaches a channel region of a TFT. In addition, in JP-A-2003-262888, the technology of reducing incident light incident to a channel region of a TFT as much as possible while ensuring an operation suitable for the TFT and narrowing a scan line is disclosed.

However, if the TFT is shielded by the above-described light-shielding film, the light-shielding film and a semiconductor layer configuring the TFT are three-dimensionally separated from each other by, for example, an insulating film or the like, and incident light obliquely incident from the side of the light-shielding film reaches the semiconductor layer configuring the TFT. Accordingly, since light leak current occurs in the TFT, flicker due to the light leak current in the TFT or display failure such as uneven pixels occurs and thus quality of an image deteriorates.

SUMMARY

An advantage of some aspects of the invention is that it provides an electro-optical device, such as a liquid crystal device driven in an active matrix manner, which is capable of reducing occurrence of light leak current in pixel switching TFTs and displaying a high-quality image, and an electronic apparatus including the electro-optical device.

According to an aspect of the invention, there is provided an electro-optical device including: on a substrate, scan lines extending in a first direction; data lines extending in a second direction intersecting the scan lines; pixel electrodes provided in pixels in correspondence with intersections of the scan lines and the data lines; a semiconductor layer including a channel region having a channel length along one of the first direction and the second direction, a source region having a source length along the second direction and electrically connected to the data lines, a drain region having a drain length including a portion along the first direction and electrically connected to the pixel electrodes, a first junction region formed between the channel region and the source region, and a second junction region formed between the channel region and the drain region, and bent in the drain region in correspondence with the intersection of the data lines and the scan lines on the substrate in plan view; a gate electrode including a main body portion facing the channel region with a gate insulating film interposed therebetween and an enclosure portion including an L-shaped portion enclosing at least the second junction region along the portion bent in the drain region on the substrate in plan view; and sidewall portions rising or falling from the enclosure portion and including a portion surrounding the second junction region from the side thereof.

According to the electro-optical device of the invention, upon the operation thereof, the scan signals are supplied from the scan lines while the supply of the image signals from the data lines to the pixel electrodes is controlled, such that a so-called active matrix type image display is realized. In addition, the image signals are supplied from the data lines to the pixel electrodes via transistors at the predetermined timings by turning on/off the transistors, which are switching elements electrically connected between the data lines and the pixel electrodes, according to the scan signals supplied from the scan lines. The pixel electrodes are transparent electrodes formed of a transparent conductive material such as Indium Tin Oxide (ITO), and the plurality of pixel electrodes is provided in a matrix, in a region which becomes the display region on the substrate, in correspondence with the intersections of the data lines and the scan lines.

In the invention, the transistors which are switching elements are formed so as to include the semiconductor layer and the data lines. The semiconductor layer includes the channel region, the source region, the drain region, the first junction region formed between the channel region and the source region, and the second junction region formed between the channel region and the drain region. In particular, the semiconductor layer has a shape bent in the drain region on the substrate in correspondence with the intersections of the data lines and the scan lines in plan view. That is, the semiconductor layer has the L-shaped portion bent in the drain region. The channel region of the semiconductor layer is formed so as to have the channel length along the first direction or the second direction, and the source region is formed along the same direction as the channel length. The drain region is formed along the direction different from the channel region and the source region (for example, the second direction if the channel region and the source region are formed along the first direction). In addition, an angle between the first direction and the second direction (that is, the bending angle of the semiconductor layer having the L-shaped portion) is in a range from 0 degrees to 180 degrees.

By forming the semiconductor layer in the L-shape, it is possible to decrease the distance between the plurality of TFTs formed on the substrate, compared with the case where the semiconductor layer is longitudinally formed along a specific direction. If the semiconductor layer is longitudinally formed along the specific direction, the size of the semiconductor layer in one direction is increased, and the pixel pitch defined by the arrangement interval of the TFTs is inevitably increased. In contrast, since the semiconductor layer of the invention has the L-shaped portion bent in the drain region, the size along one direction is not increased. As a result, the size of the TFTs can be decreased and the pixel pitch can be also decreased. According to the invention, by forming the semiconductor layer in the L-shape, it is possible to realize an electro-optical device such as a liquid crystal device with a small pixel pitch and with high accuracy.

The gate electrode of the transistor include the main body portion formed so as to face the channel region with the gate insulating film interposed therebetween and the enclosure portion including an L-shaped portion enclosing at least the second junction region along the portion bent in the drain region on the substrate in plan view. According to the research of the present inventor, in the semiconductor layer, the second junction region is apt to generate light leak current. Accordingly, by providing the enclosure portion in the gate electrode, it is possible to shield the second junction region from light with more certainty and to efficiently prevent generation of the light leak current. The gate electrode may be formed of a conductive material having a light-shielding property, and typically polysilicon or the like.

The main body portion of the gate electrodes is formed so as to face the channel region with the gate insulating film interposed therebetween. The main body portion mainly functions as the typical gate electrode for controlling the operation of the channel region by applying an ON/OFF voltage.

Meanwhile, the enclosure portion of the gate electrode includes the L-shaped portion enclosing at least the second junction region along the portion bent in the drain region. That is, the enclosure portion is formed along the contour of the semiconductor layer on the substrate in plan view. Similar to the main body portion, the enclosure portion is formed of a conductive material having a light-shielding property, and typically polysilicon or the like. By providing the enclosure portion, it is possible to mainly shield the semiconductor layer from light penetrated from the lateral or slanting direction with respect to the substrate. In particular, the sidewall regions are formed so as to surround at least the second junction region such that the light-shielding property to the second junction region is increased. The term "formed so as to surround" indicates that the sidewall regions are formed on at least partially upper, lower, left and right sides of the second junction region on the substrate in plan view. On one plane, the sidewall regions surround the periphery of the second junction region in any shape from one direction or a plurality of directions in a broad sense and surround the semiconductor layer from all directions in a narrow sense. By the gate electrode having the main body portion and the enclosure portion, it is possible to efficiently improve the light-shielding property of one region of the semiconductor layer including at least the second junction region. In particular, as the sidewall regions surround the sidewalls of the semiconductor layer on the substrate in plan view, it is possible to improve the light-shielding property with respect to light incident in several directions.

In addition, as the transistor, the double gate type thin film transistor in which the semiconductor layer is sandwiched between two gate electrodes from the top and bottom thereof or two gate electrodes are respectively present with respect to two channel regions connected in series may be established. In addition, at least three gate electrodes may be presented.

The sidewall portions rises or falls from the enclosure portion configuring the gate electrode and include the portion surrounding the second junction region from the side thereof. That is, each of the sidewall portions has a three-dimensional structure from the enclosure portion of the gate electrode surrounding at least the second junction region upward or downward. Accordingly, the sidewall portions are, for example, formed of a material having a light-shielding property, such as light-shielding metal provided only for light shielding or light-shielding metal (for example, nickel, titanium or the like) placed in the contact hole passing through the side of the semiconductor layer in the vertical direction as a plug such that the light-shielding property of one region of the semiconductor layer including the second junction region can be further improved. For example, although light is hard to be shielded in only the gate electrode (that is, the main body portion and the enclosure portion) formed on the upper layer side of the semiconductor layer like light incident to the substrate from an angle close to the lateral direction, it is possible to shield the light by three-dimensionally surrounding the second junction region by the sidewall portions. By providing the sidewall portions, it is possible to obtain an excellent light-shielding property with respect to light incident to one region of the semiconductor layer including the second junction region from several angles.

As described above, according to the electro-optical device of the invention, by forming the semiconductor layer in the L-shape, it is possible to further decrease the size of the TFTs and to realize an electro-optical device with high accuracy. By providing the enclosure portion in the gate electrode and further forming the sidewall portions, it is possible to improve the light-shielding property of the second junction region. Accordingly, it is possible to suppress generation of light leak current in one region of the semiconductor layer including the second junction region and to reduce deterioration of image quality or malfunction. As a result, it is possible to realize an electro-optical device capable of realizing a high-quality image display.

In one aspect of the invention, the sidewall portions may include a portion used for a contact for electrically connecting the enclosure portion and the scan lines.

According to this aspect, the sidewall portions rising or falling from the enclosure portion of the gate electrode are formed of a conductive material and electrically connect the enclosure portion and the scan lines. For example, a portion of the interlayer insulating film laminated between the enclosure portion and the scan lines can be removed and the sidewall portions may be provided therein as the plug for electrically connecting the enclosure portion and the scan lines. By using the sidewall portions as the portion of the wire between the conductive layers (that is, the enclosure portion and the scan lines) of the laminated structure, it is possible to suppress the complication of the laminated structure to the minimum and to realize an efficient laminated structure. As a result, since the laminated structure can be simply held, it is possible to realize an electro-optical device with high accuracy. Since the number of manufacturing steps can be reduced, it is possible to realize an electro-optical device which is excellent in suppression of manufacturing cost.

In an another aspect of the invention, the second junction region is placed on the substrate in an intersection region of each of the data lines and each of the scan lines or in a region closer to the intersection region than the channel region in plan view.

By placing the second junction region at such a position, it is possible to more efficiently shield the second junction region from the light penetrating into one region of the semiconductor layer including the second junction region. That is, as described above, the enclosure portion of the gate electrode or the sidewall portions is placed such that the light-shielding property of the periphery of the L-shaped portion (that is, the intersection region and the region close thereto) of the semiconductor layer can be efficiently improved. Accordingly, by placing the second junction region, in which light leak current is apt to be generated, in the region (that is, the intersection region and the region close thereto), it is possible to efficiently protect the second junction region from the light incident from several directions.

In a still another aspect of the invention, the enclosure portion further includes a portion enclosing the second junction region from the opposite side of the L-shaped portion on the substrate in plan view, and each of the sidewall portions further includes a portion enclosing the second junction region from the side of the opposite side.

According to this aspect, the enclosure portion of the gate electrode and the sidewall portions are formed on the substrate to surround the second junction region from both sides of the bent region of the semiconductor layer in plan view. In addition, the portion enclosing the second junction region from the opposite side may face the L-shaped portion facing or opposing the L-shaped portion (that is, an inverted L-shaped portion).

By providing the enclosure portion and the sidewall portions formed of a light-shielding material at both sides of the semiconductor layer, it is possible to block light incident from a wider direction, compared with the case where the enclosure portion and the sidewall portions are provided only at one side. As a result, in one region of the semiconductor layer including the second junction region, it is possible to suppress generation of light leak current with more certainty and to reduce deterioration of image quality or malfunction.

In a still another aspect of the invention, the enclosure portion has an annular shape on the substrate in plan view.

According to this aspect, the enclosure portion of the gate electrode is formed in the annular shape so as to surround the second junction region. Here, the "annular shape" includes a polygon of a triangle or more such as a rectangle, a circle, and an ellipse in the contour and a combination thereof in a broad sense, and is basically a shape surrounding the second junction region in an endless shape. That is, the enclosure portion is opened in the vicinity of the second junction region on the substrate in plan view.

A portion of the enclosure portion having the annular shape is formed so as to face the channel region with the gate insulating film interposed therebetween. The other portion of the enclosure portion is formed so as to face the drain region. Accordingly, for example, it is possible to shield light obliquely incident to the second junction region from the upper layer side of the portion of the gate electrode facing the channel region or the portion of the gate electrode facing the drain region. Since the enclosure portion is formed in the annular shape, the enclosure portion faces both sides of the second junction region. Accordingly, for example, it is possible to shield light incident to the second junction region from both sides thereof.

In this aspect, in particular, as described above, the enclosure portion is formed in the annular shape, and the opening is formed in the central portion thereof so as to expose the second junction region. If the main body portion is formed so as to be close to the second junction region up to, for example, the thickness of the gate insulating film, the electrode portion or the wire portions functions as an electrode for applying the same potential as the gate voltage more or less with respect to the junction region. However, in the invention, in particular, since the opening is formed in the central portion so as to expose the second junction region, the enclosure portion and the second junction region are not close to each other to a degree that generation of leak current or a change in ON/OFF threshold value is caused as described above. Accordingly, it is possible to efficiently prevent operation failure of the transistor.

In a still another aspect of the invention, each of the sidewall portions has a protrusion protruding the semiconductor layer on the substrate such that a second distance from the semiconductor layer at the front end side thereof is shorter than a first distance from the semiconductor layer in the second junction region in plan view, and includes a rising portion or a falling portion from the protrusion.

According to the research of the present inventor, if the distance between the sidewall portions and the second junction region is short on the substrate in plan view, the sidewall portions, to which the gate potential is applied, function as the gate electrode, to which the gate voltage is applied more or less, with respect to the second junction region. In contrast, if the distance between the sidewall portions and the second junction region is long, the effect that the light obliquely incident from the direction along the longitudinal direction and reaching at least one of the first and second junction regions of the semiconductor layer is blocked deteriorates.

According to this aspect, the first distance between the sidewall portions and the semiconductor layer in the vicinity of the second junction region is increased so as not to increase light leak current, and the protrusion is provided on the front end side separated from the second junction region such that the second distance between the sidewall portions and the semiconductor layer is decreased. Accordingly, by applying an electric field from the sidewall portions to the second junction region so as to perform activation, it is possible to reduce light reaching the junction region, such as oblique light, with more certainty while suppressing malfunction of the TFTs. In the vicinity of the second junction region, since the distance from the semiconductor layer can be sufficiently ensured, it is possible to prevent the sidewall portions from functioning as the gate electrode with respect to the second junction region.

In a still another aspect of the invention, the second junction region is a Lightly Doped Drain (LDD) region.

According to this aspect, the semiconductor layer has an LDD region (that is, for example, an impurity region obtained by injecting impurities into the semiconductor layer by impurity injection such as an ion implantation method) and is established as an LDD type thin film transistor. In addition to the second junction region, the first junction region may be also the LDD region.

If light leak current occurs in the LDD region (hereinafter, properly referred to as a "pixel electrode side LDD region") formed as the second junction region, in the characteristics of the transistor having the LDD structure, when the transistor is turned off, current flowing in the data line side source/drain region and the pixel electrode side source/drain region (that is, off current) is increased.

In the present aspect, it is possible to efficiently shield the light incident to the pixel electrode side LDD region by the enclosure portion of the gate electrode and the sidewall portions. Accordingly, as described above, it is possible to efficiently prevent the off current from being increased and to display a high-quality image.

In a still another aspect of the invention, the electro-optical device further includes an upper light-shielding film laminated on an upper layer side of the semiconductor layer and formed on the substrate with a width larger than that of at least the channel region and the second junction region in plan view.

By forming the upper light-shielding film, it is possible to efficiently block light from the upper side of the substrate to the channel region and the second junction region. In particular, by forming the upper light-shielding film wider than the semiconductor layer, it is possible to shield light incident from the oblique upper side of the substrate to the channel region and the second junction region, it is possible to further improve the light-shielding property of the semiconductor layer. As a result, it is possible to more efficiently suppress generation of the light leak current in the channel region and the second junction region and to realize an electro-optical device capable of realizing a high-quality image display.

In a still another aspect of the invention, the upper light-shielding film may have a portion used for the data lines.

The upper light shielding film includes, for example, the data line for supplying the image signals to the pixel electrodes provided in the pixels. Accordingly, the data lines are formed of conductive or light-shielding non-transparent metals or the like, and is, for example, formed of a light-shielding material of metal with a relatively low melting point, such as aluminum (Al), silver (Ag), gold (Au) or copper (Cu), metal alone including at least one of high melting point metal such as Ti, alloy, metal silicide, polysilicide and a lamination thereof, similar to the lower light-shielding film. Since the upper light-shielding film can be formed after the TFTs are completed, metal withstanding a high-temperature treatment upon manufacture of the TFTs may not be used. In contrast, Al or the like is preferably used in consideration of conductivity, manufacturing cost or the like.

By using the data lines for supplying the image signals as the upper light-shielding film, it is possible to efficiently form a laminated structure without complicating the laminated structure on the substrate, compared with the case where the light-shielding film is separately formed in addition to the data lines.

In a still another aspect of the invention, the electro-optical device further includes a lower light-shielding film laminated on a lower layer side of the semiconductor layer and formed on the substrate with a width larger than that of at least the channel region and the second junction region in plan view.

By forming the lower light-shielding film, it is possible to efficiently block light from the lower side of the substrate to the channel region and the second junction region. In particular, by forming the lower light-shielding film wider than the semiconductor layer, it is possible to shield light from the oblique lower side of the substrate to the channel region and the second junction region and thus to further improve the light-shielding property of the semiconductor layer. As a result, it is possible to more efficiently suppress generation of the light leak current in the channel region and the second junction region and to realize an electro-optical device capable of realizing a high-quality image display.

In a still another aspect of the invention, the lower light-shielding film has a portion used for the scan lines.

According to this aspect, the lower light-shielding film is formed so as to include the scan lines for supplying the scan signals input to the gate electrodes of the switching TFTs in order to turn on/off the pixel electrodes provided in the pixels. Accordingly, the lower light-shielding film is, for example, formed of a light-shielding material of conductive and light-shielding non-transparent metal, for example, metal alone including at least one of high melting point metal such as titanium (Ti), chrome (Cr), tungsten (W), tantalum (Ta), molybdenum (Mo), palladium (Pd), alloy, metal silicide, polysilicide and a lamination thereof. That is, since the lower light-shielding film needs to be formed before the TFTs are completed, metal withstanding a high-temperature treatment upon manufacture of the TFTs is used.

By using the scan lines for supplying the scan signals as the lower light-shielding film, it is possible to efficiently form a laminated structure without complicating the laminated structure on the substrate, compared with the light-shielding film is separately formed in addition to the scan lines.

According to another aspect of the invention there is provided an electronic apparatus including the above-described electro-optical device (including the various aspects thereof).

Since the electronic apparatus of the invention includes the electro-optical device of the invention, it is possible to realize various types of electronic apparatuses capable of performing a high-quality display, such as a projection type display device, a television set, a mobile telephone, an electronic organizer, a word processor, a viewfinder-type or direct-view monitor type video tape recorder, a workstation, a videophone, a POS terminal, and a touch-panel. As the electronic apparatus of the invention, for example, an electrophoresis device such as an electronic paper can be realized.

The operations and other features of the invention will be apparent from the following description of the exemplary embodiments.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described. In addition, in the following embodiments, a TFT active matrix driving type liquid crystal device including a driving circuit mounted therein, which is an example of the electro-optical device of the invention, will be described.

Liquid Crystal Device

Figure 1:
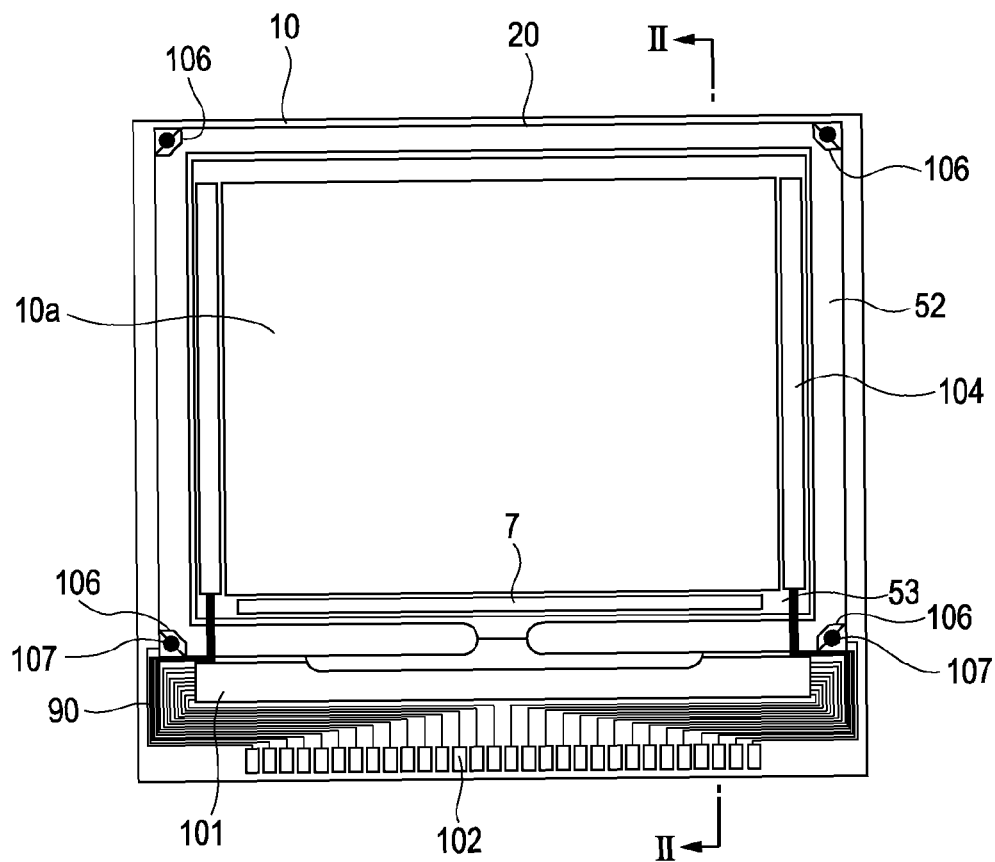
FIG. 1 is a plan view showing the overall configuration of a liquid crystal device according to the present embodiment.

First, the overall configuration of the liquid crystal device according to the present embodiment will be described with reference to FIGS. 1 and 2. FIG. 1 is a plan view showing the overall configuration of the liquid crystal device according to the present embodiment, and FIG. 2 is a cross-sectional view taken along line II-II of FIG. 1.

Figure 2:
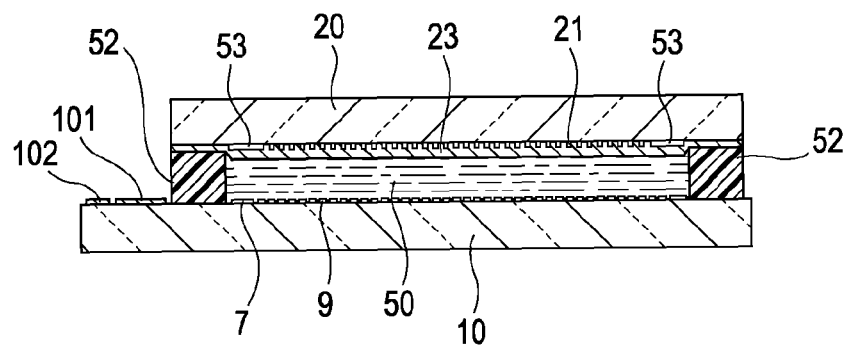
FIG. 2 is a cross-sectional view taken along line II-II of FIG. 1.

In FIGS. 1 and 2, in the liquid crystal device according to the present embodiment, a TFT array substrate 10 and a counter substrate 20 face each other. The TFT array substrate 10 is, for example, a transparent substrate such as a quartz substrate or a glass substrate, or a silicon substrate. The counter substrate 20 is, for example, a transparent substrate such as a quartz substrate or a glass substrate. A liquid crystal layer 50 is enclosed between the TFT array substrate 10 and the counter substrate 20. The TFT array substrate 10 and the counter substrate 20 are bonded to each other by a seal material 52 provided in a seal region located at the periphery of an image display region 10a in which a plurality of pixel electrodes is provided.

The seal material 52 is formed of, for example, ultraviolet curing resin or thermosetting resin for bonding both substrates, is coated on the TFT array substrate 10 and is cured by irradiating an ultraviolet ray or performing heating treatment in a manufacturing process. In the seal material 52, a gap material for holding a gap (inter-substrate gap) between the TFT array substrate 10 and the counter substrate 20 at a predetermined value, such as glass fiber or glass beads, is dispersed.

A frame light-shielding film 53 defining a frame region of the image display region 10a is provided on the counter substrate 20 at the inside of the seal region in which the seal material 52 is provided. A portion or whole of the frame light-shielding film 53 may be provided on the TFT array substrate 10 as a built-in light-shielding film.

In a region located outside the seal region, in which the seal material 52 is provided, of a peripheral region, a data line driving circuit 101 and an external circuit connection terminal 102 are provided along one side of the TFT array substrate 10. A sampling circuit 7 is provided so as to cover the frame light-shielding film 53 at the inside of the seal region along one side. Scan line driving circuits 104 are provided along two sides adjacent to one side so as to cover the frame light-shielding film 53.

Upper/lower conductive materials 106 for connecting both substrates using upper/lower conductive materials 107 are placed on the TFT array substrate 10 in regions facing four corners of the counter substrate 20. Accordingly, the TFT array substrate 10 and the counter substrate 20 are electrically conducted.

In FIG. 2, on the TFT array substrate 10, a laminated structure made of pixel switching TFTs or wires such as scan lines and data lines is formed. In the image display region 10a, pixel electrodes 9 made of a transparent material such as Indium Tin Oxide (ITO) are provided in a matrix on the pixel switching TFTs or the wires such as the scan lines and the data lines. An alignment film (not shown in FIG. 2) is formed on the pixel electrodes 9. Meanwhile, a black matrix 23 is formed on a surface of the counter substrate 20 facing the TFT array substrate 10. The black matrix 23 is formed of, for example, a light-shielding metal film or the like and is patterned, for example, in a lattice shape or a stripe shape in the image display region 10a of the counter substrate 20. A counter electrode 21 made of a transparent material such as ITO is formed on the black matrix 23 over the entire surface of the counter substrate 20 (for example, solidly) so as to face the plurality of pixel electrodes 9. An alignment film (not shown in FIG. 2) is formed on the counter electrode 21.

The liquid crystal layer 50 is formed between the TFT array substrate 10 and the counter substrate 20 placed such that the pixel electrodes 9 and the counter electrode 21 face each other. The liquid crystal layer 50 is formed of, for example, liquid crystal obtained by mixing one type or various types of nematic liquid crystal, and is in a predetermined alignment state between the pair of alignment films.

In addition, a precharge circuit for supplying a precharge signal having a predetermined voltage level to the plurality of data lines prior to the image signals, a test circuit for testing the quality and the defect of the electro-optical device during manufacturing or before shipment, or test patterns may be formed on the TFT array substrate 10 shown in FIGS. 1 and 2, in addition to the data line driving circuit 101 and the scan line driving circuits 104.

Figure 3:
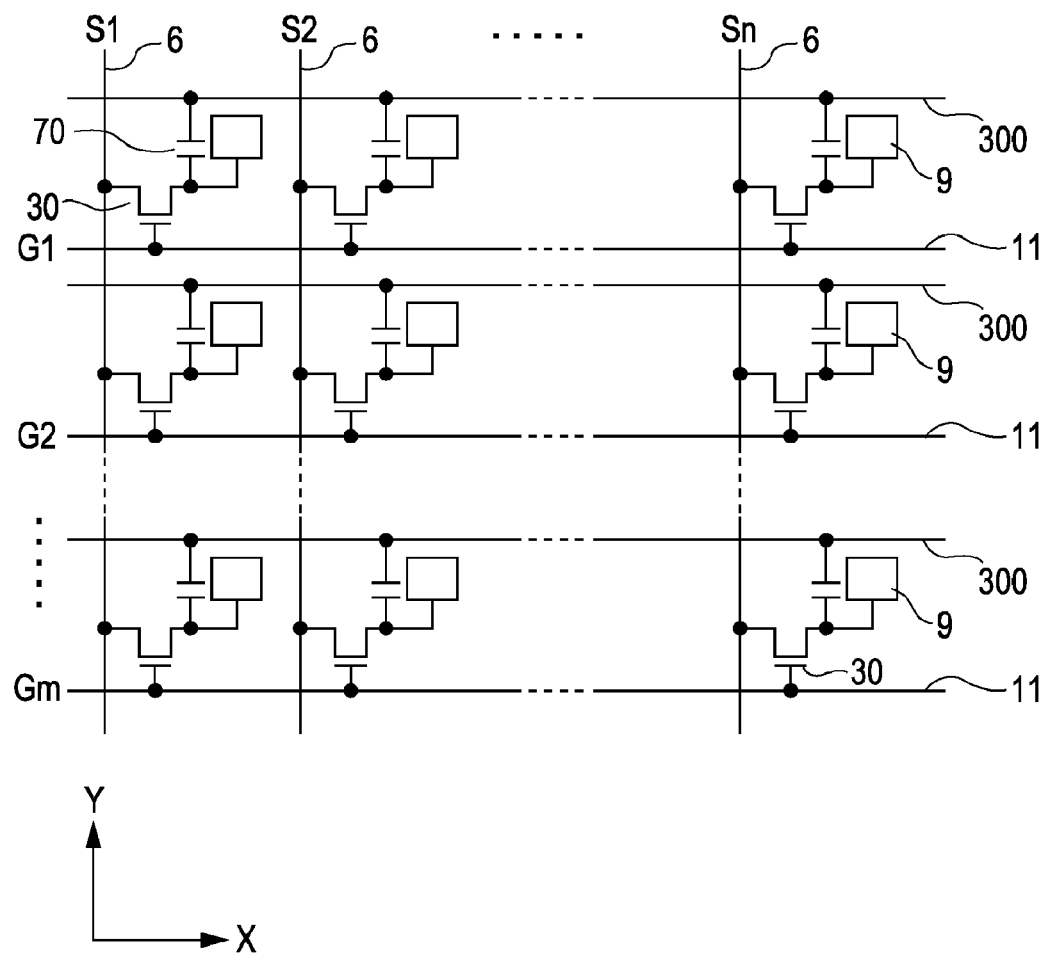
FIG. 3 is a block diagram showing the electrical configuration of the liquid crystal device according to the present embodiment.

Next, the electrical configuration of the image display region of the liquid crystal device according to the present embodiment will be described with reference to FIG. 3. FIG. 3 is an equivalent circuit diagram of various types of elements and wires in the plurality of pixels formed in a matrix configuring the image display region of the liquid crystal device according to the present embodiment.

In FIG. 3, pixel switching TFTs 30 and the pixel electrode 9 are formed in the plurality of pixels formed in the matrix configuring the image display region 10a. The TFTs 30 are electrically connected to the pixel electrodes 9, and control the switching of the pixel electrodes 9 when the liquid crystal device is operated. Image signals S1, S2 . . . and Sn written into the data lines 6 may be line-sequentially supplied in this order or may be supplied to groups of a plurality of adjacent data lines 6.

The scan lines 11 are electrically connected to gates of the TFTs 30, and the liquid crystal device according to the present embodiment is configured such that scan signals G1, G2, . . . , and Gm are line-sequentially applied to the scan lines 11 in this order in a pulsed manner at predetermined timings. The image signals S1, S2 . . . and Sn supplied from the data lines 6 are written at predetermined timings by closing the TFTs 30, which are the switching elements, only during a predetermined period. The image signals S1, S2, . . . , and Sn having the predetermined level, which are written into the liquid crystal via the pixel electrodes 9, are held between the counter electrode 21 (see FIG. 2) formed on the counter substrate 20 (see FIG. 2) and the pixel electrodes during a predetermined period.

In the liquid crystal configuring the liquid crystal layer 50 (see FIG. 2); the alignment or order of a set of molecules is changed by the level of the applied voltage such that light is modulated and grayscale display becomes possible. Transmissivity of the incident light is decreased according to the applied voltage in the unit of pixels in a normally white mode, and transmissivity of incident light is increased according to the applied voltage in the unit of pixels in a normally black mode. Light having the contrast according to the image signals is wholly emitted from the liquid crystal device.

In order to prevent the held image signals from being leaked, storage capacitors 70 are provided in parallel with liquid crystal capacitors formed between the pixel electrodes 9 and the counter electrode 21 (see FIG. 2). The storage capacitors 70 are capacitive elements functioning as storage capacitors for temporarily holding the potential of the pixel electrodes 9 according to the supply of the image signals. Although the detailed structure of the storage capacitors 70 will be described later, one electrode of each of the storage capacitors 70 is connected to the drain of each of the TFTs 30 in parallel with each of the pixel electrodes 9, and the other electrode thereof is connected to each of capacitive lines 300 having a fixed potential so as to have a constant potential. By providing the storage capacitors 70, the potential holding characteristics of the pixel electrodes 9 are improved and thus improvement of display characteristics such as improvement of contrast or reduction of flicker can be achieved.

Next, the overall configuration of the laminated structure on the TFT array substrate 10 for realizing the above-described operation will be described with reference to FIGS. 4 to 8.

Figure 4:
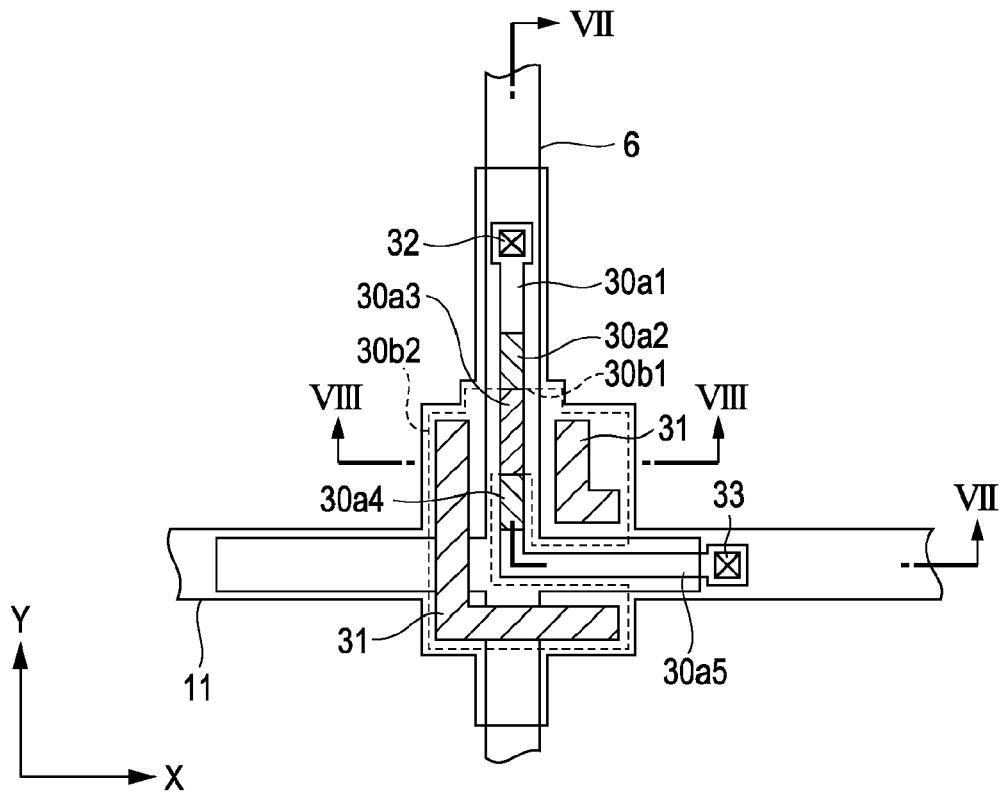
FIG. 4 is a plan view showing the configuration of the periphery of a TFT of the liquid crystal device according to the present embodiment.

FIG. 4 is a plan view showing the configuration of the periphery of the TFTs 30 of the electro-optical device according to the present embodiment. In FIG. 4, the scale of each layer or each member is differentiated from each other in order that each layer or each member has a size capable of being identified in the view. In FIG. 4, for convenience of description, each layer is transmissively shown.

As shown in FIG. 4, the data lines 6 and the scan lines 11 are placed to intersect each other. The scan lines 11 extend along an X direction of the drawing and the data lines 6 extend along a Y direction of the drawing. Although not shown herein, the plurality of pixel electrodes 9 is provided in opened regions (that is, regions, in which light actually contributing to the display is transmitted or reflected, in the pixels) defined by the data lines 6, the scan lines 11 and various wires, in every pixel.

The pixel switching TFTs 30 are placed in correspondence with the intersections of the scan lines 11 and the data lines 6. As shown in FIG. 4, each of the TFTs 30 includes a semiconductor layer 30a and a gate electrode 30b.

The semiconductor layer 30a configuring the TFTs 30 includes a source region 30a1, a first LDD region 30a2, a channel region 30a3, a second LDD region 30a4, and a drain region 30a5. The first LDD region 30a2 is formed between the source region 30a1 and the channel region 30a3. The second LDD region 30a4 is formed between the drain region 30a5 and the channel region 30a3.

The regions of the semiconductor layer 30a are impurity regions obtained by injecting impurities into the semiconductor layer 30a by impurity injection such as an ion implantation method. In particular, the first LDD region 30a2 and the second LDD region 30a4 are formed as impurity regions having impurity concentrations lower than those of the source region 30a1 and the drain region 30a5, respectively. According to such impurity regions, the off current flowing between the data line side source/drain region 30a1 and the drain region 30a5 upon the non-operation of the TFTs 30 can be reduced and reduction of on current flowing upon the operation of the TFTs 30 can be suppressed.

In the present embodiment, in particular, the semiconductor layer 30a is formed on the TFT array substrate 10 to have an L-shaped portion bent in the drain region 30a5, in plan view. That is, in the semiconductor layer 30a, the source region 30a1, the first LDD region 30a2, the channel region 30a3 and the second LDD region 30a4 are formed along the Y direction, and the drain region 30a5 is formed so as to partially extend in the X direction. The second LDD region 30a4 which is a "second junction region" of the invention is placed in a region in which the data line 6 and the scan line 11 intersect each other (that is, a region in which the data line 6 and the scan line 11 overlap with each other in FIG. 4).

Figure 5:
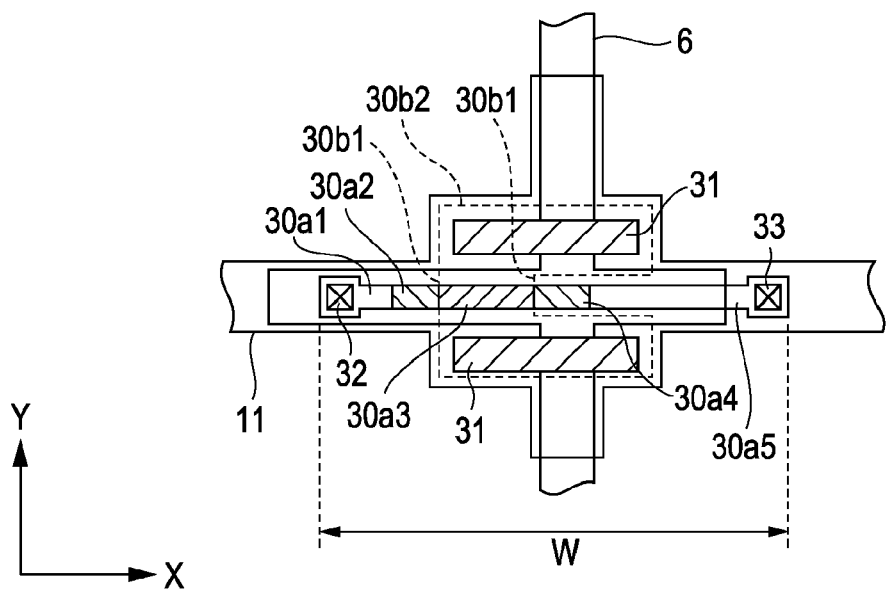
FIG. 5 is a plan view showing the configuration of the periphery of a TFT of a liquid crystal device according to a comparative example.

The effect due to the formation of the semiconductor layer 30a with the L-shape will be described in detail with reference to a comparative example shown in FIG. 5. FIG. 5 is a plan view showing the configuration of the periphery of TFTs 30 of a liquid crystal device according to the comparative example. FIG. 5 is different from the present embodiment of FIG. 4 in that the semiconductor layer 30a is formed along the X direction in a typical shape such as an elongated shape.

In the electro-optical device such as the liquid crystal device, in order to realize an image display with higher accuracy, a pixel pitch (that is, an inter-pixel distance) needs to be decreased in order to increase a pixel number of the image display region 10a. In the comparative example shown in FIG. 5, the pixel pitch is defined by the length of the semiconductor 30a formed in the elongated shape. That is, in the comparative example, the pixel pitch cannot be smaller than the length W of the semiconductor layer 30a. However, the decrease in size of the semiconductor layer 30a is technically limited and thus the decrease in pixel pitch in the semiconductor layer 30a having the elongated shape is limited. In the present embodiment shown in FIG. 4, since the semiconductor layer 30a has the bending shape, that is, the L-shape, the semiconductor layer 30a can be formed more compactly than the comparative example shown in FIG. 5. Like the invention, the semiconductor layer 30a is formed in the L-shape such that the pixel pitch is further decreased. As a result, it is possible to realize a liquid crystal device capable of realizing a high-accuracy image display and a short pixel pitch.

Returning to FIG. 4, the structure of the gate electrode 30b will be described in detail. The gate electrode 30b includes a main body portion 30b1 (that is, a region overlapping with the channel region 30a3 in FIG. 4) and an enclosure portion 30b2.

First, the main body portion 30b1 is formed on the TFT array substrate 10 so as to include the region overlapping with the channel region 30a2 of the semiconductor layer 30a in plan view. By placing the main body portion 30b1 on the channel region 30a3, ON/OFF of the scan signal which is the typical function of the gate electrode is performed by the TFTs 30.

Meanwhile, the enclosure portion 30b2 of the gate electrode 30b is formed along both sides of the semiconductor layer 30a. In particular, the enclosure portion 30b2 is placed on the TFT array substrate 10 so as to surround the second LDD region 30a4 in plan view.

Sidewall portions 31 are provided on the lower layer side of the enclosure portion 30b2 in a direction perpendicular to the substrate, and electrically connect the enclosure portion 30b2 of the gate electrode 30b and the scan line 11 placed on the lower layer side.

Figure 6:
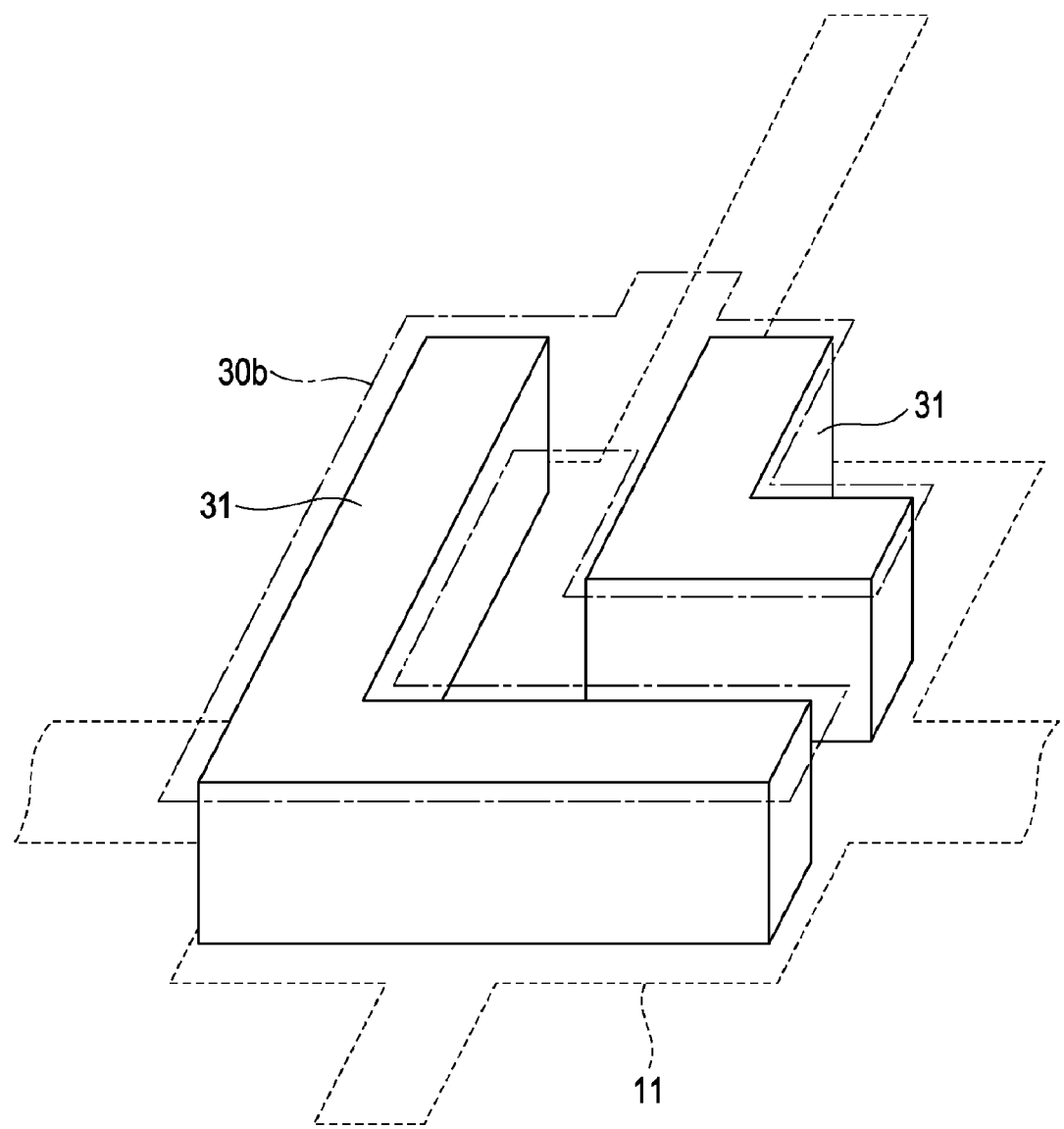
FIG. 6 is a schematic diagram conceptually extracting a scan line, a gate electrode and sidewall portions of the liquid crystal device according to the present embodiment.

FIG. 6 is a conceptual diagram extracting the scan line 11, the gate electrode 30b and the sidewall portions 31 from FIG. 4 and three-dimensionally showing the positional relationship therebetween. The gate electrode 30b (that is, the main body portion 30b1 and the enclosure portion 30b2) has a shape in which the center thereof is opened so as to surround the second LDD region 30a4 on the upper layer side thereof. The two sidewall portions 31 are formed at both sides of the semiconductor layer 30a so as to surround the second LDD region 30a4 (not shown in FIG. 6) and fall from the gate electrode 30b. The sidewall portions 31 are electrically connected to the scan line 11 placed on the lower layer side so as to function as a wire for electrically connecting the scan line 11 and the gate electrode 30b.

By three-dimensionally forming the sidewall portions 31 so as to surround the second LDD region 30a4, the light-shielding property of the second LDD region 30a4 is improved. That is, with respect to the TFT array substrate 10, the light-shielding property of the second LDD region with respect to light incident in a lateral direction or a slanting direction can be improved. Accordingly, it is possible to suppress generation of light leak current in the channel region 30a3 and the second LDD region 30a4.

Figure 7:
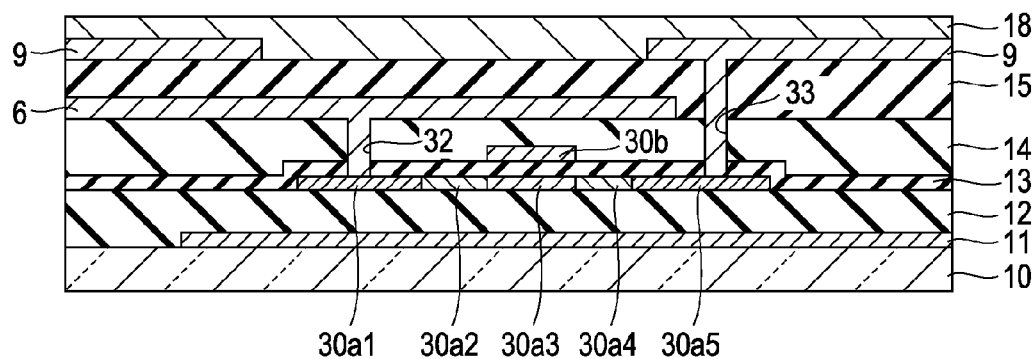
FIG. 7 is a cross-sectional view taken along line VII-VII of FIG. 4.

Subsequently, the laminated structure in the vicinity of the TFTs 30 will be described in detail with reference to FIG. 7. FIG. 7 is a cross-sectional view taken along line VII-VII of FIG. 4. In FIG. 7, the scale of each layer or each member is differentiated from each other in order that each layer or each member has a size capable of being identified in the view. The configuration of the storage capacitor 70 or the like shown in FIG. 2 is omitted.

The scan line 11 is provided on the TFT array substrate 10. The scan line 11 is, for example, formed of a light-shielding material of metal alone including at least one of high melting point metal such as Ti, Cr, W, Ta, Mo or Pd, alloy, metal silicide, polysilicide and a lamination thereof. That is, a lower light-shielding film of the invention is the scan line 11 in the present embodiment. Accordingly, the scan line 11 shields the channel region 30a3 of the TFTs 30 and the periphery thereof from return light incident from the TFT array substrate 10 into the device, such as light emitted from another liquid crystal device and passing through a synthetic optical system by rear surface reflection of the TFT array substrate 10 or a double-plate type projector, as the lower light-shielding film. In particular, in the present embodiment, the scan line 11 is formed with a width larger than that of the TFT array substrate 10 so as to include the semiconductor layer 30a in plan view. By widely forming the scan line 11 functioning as the lower light-shielding film, it is possible to efficiently shield the light incident in the slanting direction or the lateral direction as well as the light incident to the semiconductor layer 30a vertically to the TFT array substrate 10.

The semiconductor layer 30a is formed on the scan line 11 with an underlying insulating film 12 interposed therebetween. The gate electrode 30b (a flat region 30b2 in FIG. 6) is placed on the upper layer side of the semiconductor layer 30a with a gate insulating film 13 interposed therebetween.

The data line 6 is laminated on the upper layer side of the gate electrode 30b2 with an interlayer insulating film 14 interposed therebetween. The data line 6 is electrically connected to the source region 30a1 of the semiconductor layer 30a via a contact hole 32. In the present embodiment, in particular, the data line 6 is formed of non-transparent metal or the like and functions as an upper light-shielding film in the invention. Accordingly, since the light incident from the upper side of the TFT array substrate 10 to the semiconductor layer 30a is shielded by the data line 6, the light-shielding property of the semiconductor layer 30a can be improved.

The pixel electrode 9 is placed on the upper layer side of the data line 6 with an interlayer insulating film 15. The pixel electrode 9 is provided in each pixel in an island shape and is, for example, formed of a conductive material such as Indium Tin Oxide (ITO). In addition, the pixel electrode 9 is electrically connected to the drain region 30a5 via a contact hole 33. The pixel electrode 9 formed on the interlayer insulating film 15 is covered by an alignment film 18.

Figure 8:
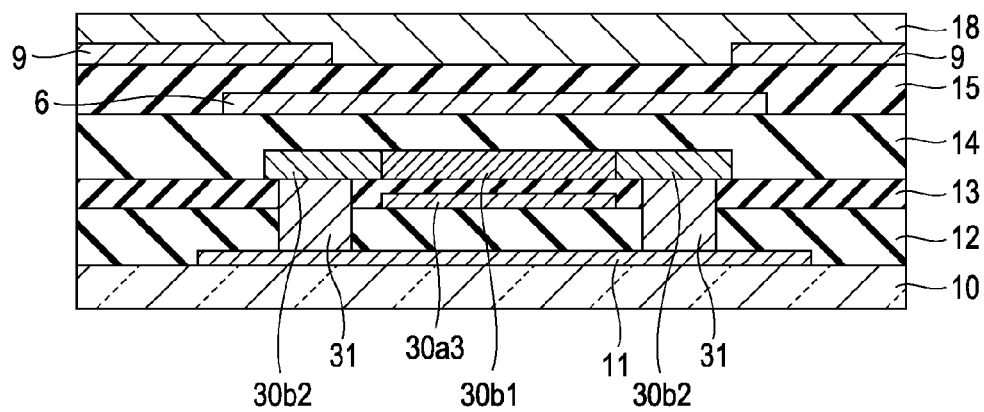
FIG. 8 is a cross-sectional view taken along line VIII-VIII of FIG. 4.

FIG. 8 is a cross-sectional view taken along line VIII-VIII of FIG. 4. In FIG. 8, the scale of each layer or each member is differentiated from each other in order that each layer or each member has a size capable of being identified in the view.

The scan line 11 functioning as the lower light-shielding film in the invention is formed on the TFT array substrate 10 with a width larger than that of the semiconductor layer 30a (that is, the channel region 30a3 of FIG. 7) formed on the upper layer side thereof, and efficiently shields the semiconductor layer 30a from the light incident from the lower side of the TFT array substrate 10.

The gate electrode 30b is formed on the semiconductor layer 30a with the gate insulating film 13 interposed therebetween. The main body portion 30b1 of the gate electrode 30b is formed on the TFT array substrate 10 so as to overlap with the channel region 30a3 in plan view. Meanwhile, the enclosure portion 30b2 is placed at both sides of the main body portion 30b1 so as to surround the second LDD region 30a4 of the semiconductor layer 30a.

The sidewall portions 31 are formed at both sides of the channel region 30a3 so as to be laminated in the contact hole opened in the underlying insulating film 12 and the gate insulating film 13. The sidewall portions 31 are formed of a conductive material having a light-shielding property, such as polysilicon, similar to the main body portion 30b1 so as to electrically connect the scan line 11 and the main body portion 30b1 of the gate electrode 30b. In addition, the sidewall portions 31 may be contact holes in which a conductive metal material is plugged or may be filled by the same material as the gate electrode.

The sidewall portions 31 are formed on the TFT array substrate 10 along the contour of the semiconductor layer 30a so as to shield the channel region 30a3 from light in the lateral or slanting direction of the TFT array substrate 10. In particular, as shown in FIG. 4, since the sidewall portions 31 are formed so as to surround the second LDD region, it is possible to efficiently improve the light-shielding property of the second LDD region.

In particular, in the present embodiment, the sidewall portions 31 extend to the channel region 30a3 or the drain region 30a5 adjacent to the second LDD region 30a4 as well as the second LDD region 30a4 such that the light-shielding property of the second LDD region 30a4 is further improved. By providing the sidewall portions 31 over a wide range, since light obliquely incident to the sidewall portions 31 can be blocked, it is possible to further improve the light-shielding property.

In addition, the sidewall portions 31 may be formed on the TFT array substrate 10 at least partially in all directions of the second LDD region in plan view and may not be completely formed in an annular shape, as shown in FIG. 4.

As described above, according to the present embodiment, by forming the semiconductor layer in the L-shaped portion bent in the drain region, it is possible to further decrease the size of the TFT. Accordingly, it is possible to realize a liquid crystal device with high accuracy. By providing the enclosure portion in the gate electrode and providing the sidewall portions falling from the enclosure portion, it is possible to improve the light-shielding property of the second LDD region. Accordingly, it is possible to reduce deterioration of image quality or malfunction due to generation of light leak current.

First Modified Example

Figure 9:
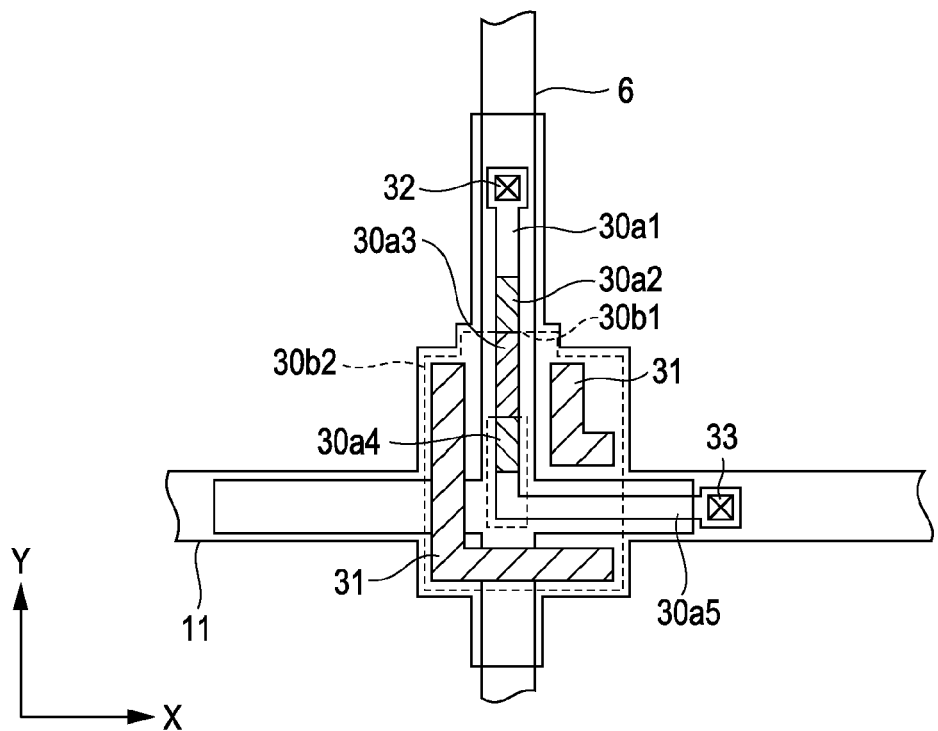
FIG. 9 is a plan view showing the configuration of the periphery of a TFT of a liquid crystal device according to a first modified example.

Subsequently, the first modified example will be described with reference to FIG. 9. In this modified example, the enclosure portion 30b2 of the gate electrode 30b is formed on the TFT array substrate 10 in an annular shape so as to surround the second LDD region 30a4 of the semiconductor layer 30a in plan view. In detail, as denoted by a dotted line of FIG. 9, the main body portion 30b1 and the enclosure portion 30b2 of the gate electrode 30b are formed in an annular shape so as to be opened in the vicinity of the second LDD region 30a4.

The gate electrode 30b includes a region facing the channel region 30a3 in the region overlapping with the channel region 30a3 so as to perform an ON/OFF switching operation of the TFTs 30, and faces the drain region 30a5. Accordingly, it is possible to shield light obliquely incident from the upper layer side of the portion of the gate electrode facing the channel region 30a3 and the portion of the gate electrode facing the drain region 30a5 to the second LDD region 30a4 and to further improve the light-shielding property of the second LDD region 30a4.

In this modified example, in particular, as described above, the enclosure portion 30b2 has an opened area at the central portion thereof so as to expose the second LDD region 30a4. If the enclosure portion 30b2 is close to the second LDD region 30a4 up to, for example, the thickness of the gate insulating film 13, the enclosure portion 30b2 functions as an electrode for applying the same potential as the gate voltage more or less with respect to the second LDD region 30a4. In this modified example, the opening is provided in the central portion of the enclosure portion so as to expose the second LDD region 30a4 such that the enclosure portion 30b2 and the second LDD region 30a4 is close to each other to a degree that generation of leak current or a change in ON/OFF threshold value is caused as described above. Accordingly, it is possible to efficiently prevent operation failure of the TFTs 30.

Second Modified Example

Subsequently, the second modified example will be described with reference to FIG. 10. In this modified example, the gate electrode 30b is formed such that the main body portion 30b1 faces the channel region 30a3 and the enclosure portion 30b2 is formed along both sides of the semiconductor layer 30a at the periphery of the main body portion 30b1, similar to the above-described embodiment (see FIG. 4). In particular, the enclosure portion 30b2 is placed on the TFT array substrate 10 so as to surround the second LDD region 30a4 in plan view such that the light-shielding property of the second LDD region from the light incident to the TFT array substrate 10 in the lateral or slanting direction is improved. Accordingly, it is possible to suppress generation of light leak current in the channel region 30a3 and the second LDD region 30a4.

In this modified example, the sidewall portions 31 are formed on the TFT array substrate 10 so as to have protrusions 38 (that is, a portion surrounded by a circle of FIG. 10) protruding to the semiconductor layer 30a such that the distance from the semiconductor layer 30a in the front end side of the second LDD region is shorter than the distance from the semiconductor layer 30a in the vicinity of the second LDD region 30a4. FIG. 11 is a schematic view conceptually extracting the sidewall portions 31, the gate electrodes 30b, and the scan line from the liquid crystal device according to the present modified example and showing the positional relationship therebetween. If the distance between the sidewall portions 31 and the second LDD region 30a4 is short in the vicinity of the second LDD region 30a4 on the TFT array substrate 10 in plan view, the sidewall portions 31 having the same potential as the gate electrode 30b functions as an electrode for applying the same potential as the gate voltage more or less with respect to the second LDD region 30a4. In contrast, if the distance between the sidewall portions 31 and the second LDD region 30a4 is long, the effect that the light obliquely incident from the direction along the longitudinal direction and reaching at least one of the first LDD region 30a2 and the second LDD region 30a4 of the semiconductor layer 30a is blocked deteriorates.

According to the present modified example, by providing the enclosure portion 30b2 in the gate electrode 30b, the light-shielding property of the second LDD region 30a4 is significantly improved. In addition, by providing the protrusions 38 on the sidewall portions 31, it is possible to reduce light reaching the second LDD region 30a4 such as oblique light with more certainty while the sidewall portions 38 do not function as the gate electrode with respect to the second LDD region 30a4.

Electronic Apparatus

Next, the application of the liquid crystal device, which is the electro-optical device, to various types of electronic apparatus will be described. FIG. 10 is a plan view showing the configuration of a projector. Hereinafter, the projector using this liquid crystal device as a light valve will be described.

Figure 10:
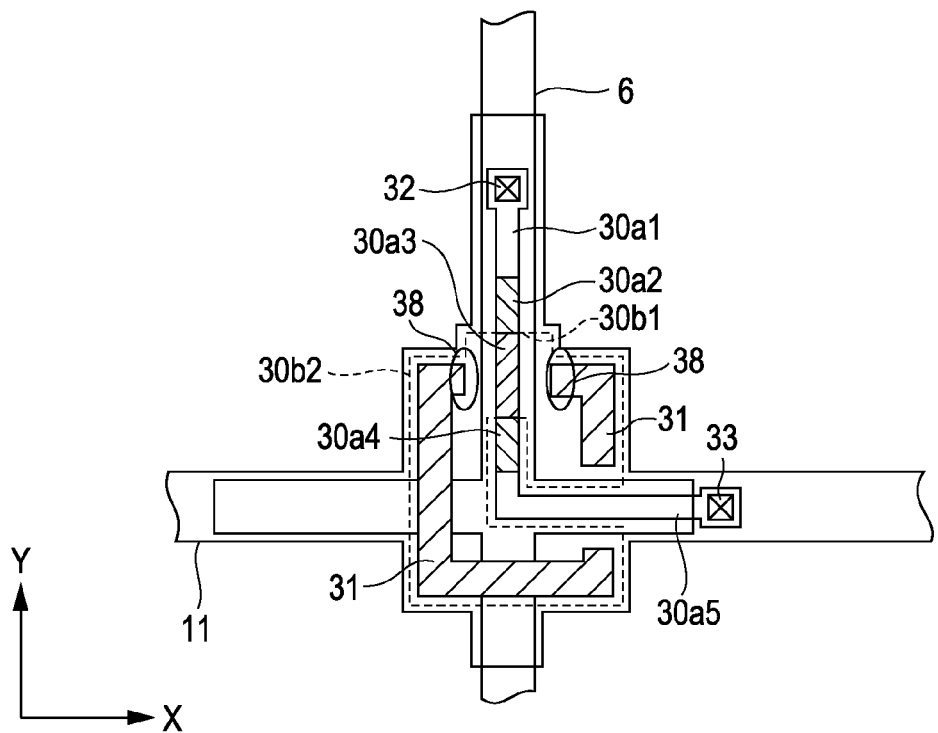
FIG. 10 is a plan view showing the configuration of the periphery of a TFT of a liquid crystal device according to a second modified example.
Figure 11:
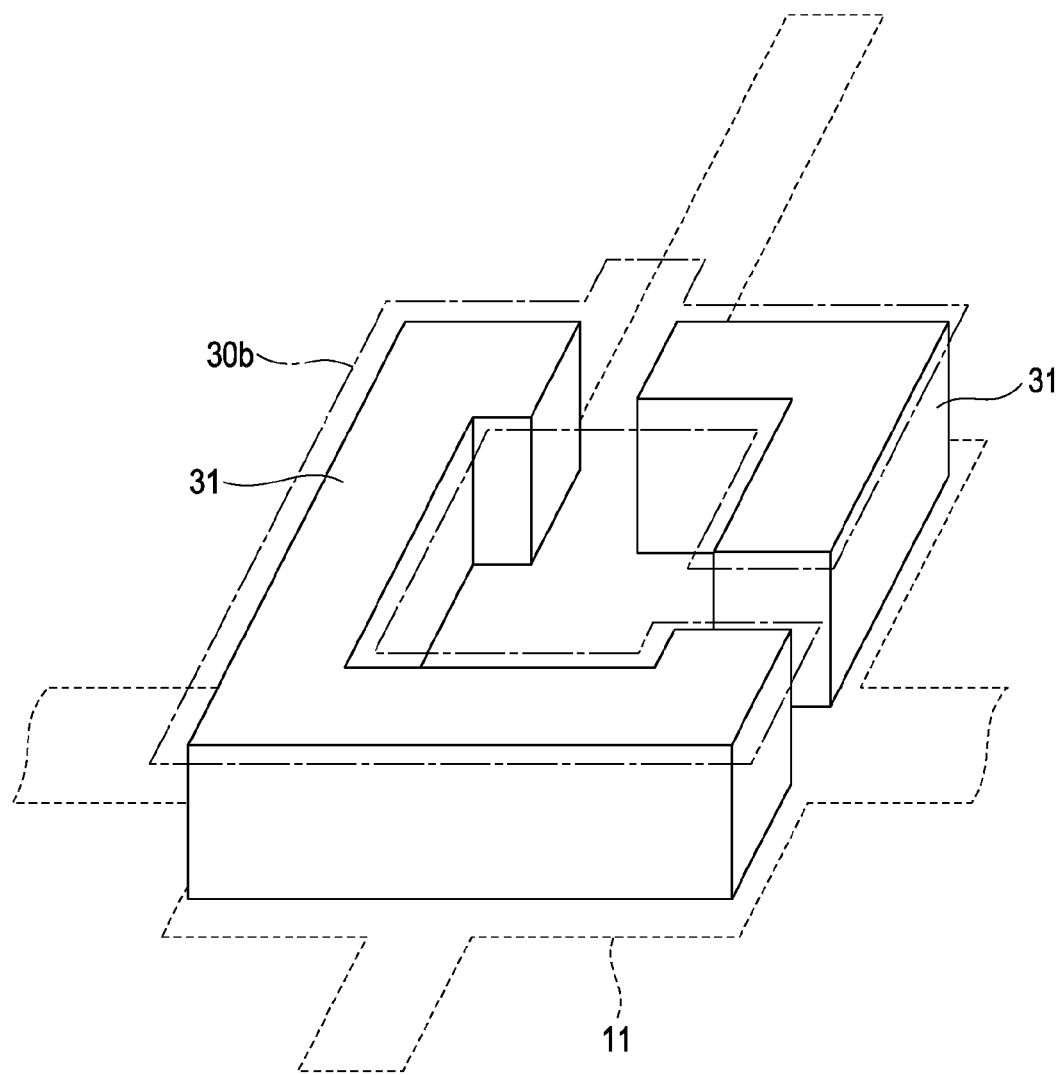
FIG. 11 is a schematic view conceptually extracting a scan line, a gate electrode and sidewall portions of the liquid crystal device according to the second modified example.
Figure 12:
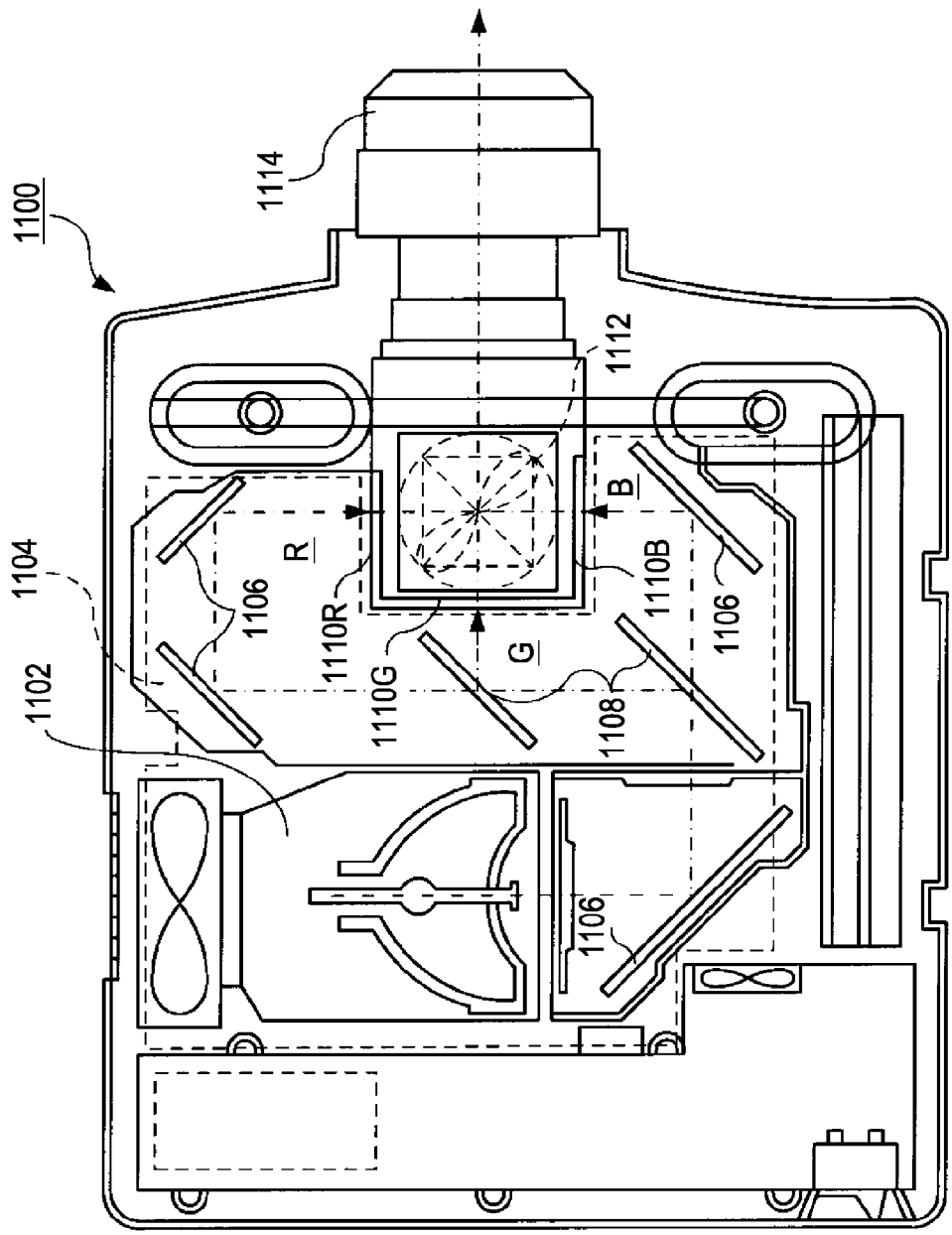
FIG. 12 is a plan view showing the configuration of a projector which is an example of an electronic apparatus including the electro-optical device.

As shown in FIG. 10, a lamp unit 1102 composed of a white light source such as a halogen lamp is provided inside the projector 1100. An incident light emitted from the lamp unit 1102 is separated into three primary colors of RGB by four mirrors 1106 and two dichroic mirrors 1108 disposed inside a light guide 1104 and the three primary colors are incident to light valves 1110R, 1110G, and 1110B as the light valves corresponding to the primary colors.

The configurations of the liquid crystal panels 1110R, 1110G, and 1110B are equal to the above-described liquid crystal device and the liquid crystal panels are driven by primary color signals of R, G, and B supplied from the image signal supply circuit. The light modulated by such liquid crystal panels is incident into a dichroic prism 1112 from three directions. In the dichroic prism 1112, the light of R and B is refracted at an angle of 90 degrees and the light of G goes straight. Therefore, the images of the colors are synthesized, whereby a color image is projected onto a screen or the like through a projector lens 1114.

Here, when attention is focused on a display image by each of the light valves 1110R, 1110G, and 1110B, the display image by the light panel 1110G is needed to be mirror-inversed with respect to the display images by the light panels 1110R and 1110B.

Further, since light corresponding to each of the primary colors of R, G and B is incident to each of the light panels 1110R, 1110G, and 1110B by the dichroic mirrors 1108, there is no need to provide a color filter.

In addition to the electronic apparatus described in FIG. 10, there are a mobile type personal computer, a mobile telephone, a liquid crystal TV set, a viewfinder-type or direct-view monitor type video tape recorder, a car navigation system, a pager, an electronic organizer, an electronic calculator, a word processor, a workstation, a videophone, a POS terminal, a touch-panel-equipped device, and the like. The invention is applicable to various types of electronic apparatuses.

In addition, the invention may also be applied to a reflective liquid crystal device (LCOS), a plasma display panel (PDP), a field emission type display (FED, SED), an organic EL display, a digital micromirror device (DMD), an electrophoresis device, and the like, in addition to the liquid crystal device described in the above-mentioned embodiments.

The invention is not limited to the above-described embodiments and modification may be properly made without departing from the spirit of the invention as defined by the appended claims and the overall specification. A substrate for an electro-optical device including such modifications, an electro-optical device, and an electronic apparatus including the electro-optical device are included in the technical range of the invention.

The entire disclosure of Japanese Patent Application No. 2008-246386, filed Sep. 25, 2008 is expressly incorporated by reference herein.

What is claimed is:
1. An electro-optical device comprising:
a scan line extending in a first direction;
a data line extending in a second direction intersecting the scan line;
a pixel electrode provided in correspondence with intersection of the scan line and the data line;
a semiconductor layer including:
    a channel region having a channel length along one of the first direction and the second direction;
    a source region having a source length along the second direction and electrically connected to the data line;
    a drain region having a drain length including a portion along the first direction and electrically connected to the pixel electrode;

a first junction region formed between the channel region and the source region; and a second junction region formed between the channel region and the drain region, and bent in the drain region in correspondence with the intersection of the data line and the scan line in plan view;

a gate electrode including:

a main body portion facing the channel region with a gate insulating film interposed therebetween; and an enclosure portion including an L-shaped portion enclosing at least the second junction region along the portion bent in the drain region in plan view; and a sidewall portion rising or falling from the enclosure portion and including a portion arranged along the side of the second junction region.

2. The electro-optical device according to claim 1, wherein the sidewall portions include a portion used for a contact for electrically connecting the enclosure portion and the scan line.

3. The electro-optical device according to claim 1, wherein the second junction region is placed in an intersection region of the data line and the scan line or in a region closer to the intersection region than the channel region in plan view.

4. The electro-optical device according to claim 1, wherein:

the enclosure portion further includes a portion enclosing the second junction region from the opposite side of the L-shaped portion in plan view, and each of the sidewall portions further includes a portion enclosing the second junction region from the side of the opposite side.

5. The electro-optical device according to claim 1, wherein the enclosure portion has an annular shape in plan view.

6. The electro-optical device according to claim 1, wherein each of the sidewall portions has a protrusion protruding the semiconductor layer such that a second distance from the semiconductor layer at the front end side thereof is shorter than a first distance from the semiconductor layer in the second junction region in plan view.

7. The electro-optical device according to claim 1, wherein the second junction region is a Lightly Doped Drain (LDD) region.

8. The electro-optical device according to claim 1, further comprising an upper light-shielding film laminated on an upper layer side of the semiconductor layer and formed with a width larger than that of at least the channel region and the second junction region in plan view.

9. The electro-optical device according to claim 8, wherein the upper light-shielding film has a portion used for the data line.

10. The electro-optical device according to claim 1, further comprising a lower light-shielding film laminated on a lower layer side of the semiconductor layer and formed with a width larger than that of at least the channel region and the second junction region in plan view.

11. The electro-optical device according to claim 10, wherein the lower light-shielding film has a portion used for the scan line.

12. An electronic apparatus comprising the electro-optical device according to claim 1.

* * * * *